(12) United States Patent
Peng

(10) Patent No.: US 10,180,697 B2
(45) Date of Patent: Jan. 15, 2019

(54) SWITCHING POWER CONVERTER WITH ZERO CURRENT AT STARTUP

(71) Applicant: DIALOG SEMICONDUCTOR INC., Campbell, CA (US)

(72) Inventor: Mingsheng Peng, Campbell, CA (US)

(73) Assignee: DIALOG SEMICONDUCTOR INC., Campbell, CA (US)

( * ) Notice: Subject to any disclaimer, the term of this patent is extended or adjusted under 35 U.S.C. 154(b) by 0 days.

(21) Appl. No.: 15/823,464

(22) Filed: Nov. 27, 2017

(65) Prior Publication Data

US 2018/0081385 A1 Mar. 22, 2018

Related U.S. Application Data

(63) Continuation of application No. PCT/US2016/058957, filed on Oct. 26, 2016.

(60) Provisional application No. 62/246,603, filed on Oct. 26, 2015.

(51) Int. Cl.

| G05F 3/26 | (2006.01) |
| G05F 3/24 | (2006.01) |
| H02M 1/00 | (2006.01) |
| H02M 1/08 | (2006.01) |
| H02M 3/155 | (2006.01) |
| H02M 1/36 | (2007.01) |
| H02M 3/335 | (2006.01) |
| H03K 17/30 | (2006.01) |

(52) U.S. Cl.
CPC ............... *G05F 3/26* (2013.01); *G05F 3/24* (2013.01); *H02M 1/00* (2013.01); *H02M 1/08* (2013.01); *H02M 1/36* (2013.01); *H02M 3/155* (2013.01); *H02M 3/33507* (2013.01); *H02M 2001/0006* (2013.01); *H02M 2001/0048* (2013.01); *H03K 17/302* (2013.01); *Y02B 70/1491* (2013.01)

(58) Field of Classification Search
CPC ........................................................ G05F 3/26
See application file for complete search history.

(56) References Cited

U.S. PATENT DOCUMENTS

| 6,111,440 | A * | 8/2000 | Rajagopalan | H03K 4/50 327/131 |
| 2005/0134345 | A1 | 6/2005 | McClure | |
| 2010/0259952 | A1 | 10/2010 | Zhu et al. | |
| 2013/0077353 | A1 | 3/2013 | Kuang et al. | |
| 2013/0155561 | A1 * | 6/2013 | Lai | H02H 3/202 361/91.5 |
| 2015/0048874 | A1 * | 2/2015 | Kurokawa | H02H 9/04 327/328 |
| 2018/0026542 | A1 * | 1/2018 | Baurle | H02M 3/33507 |

FOREIGN PATENT DOCUMENTS

| JP | 07-087733 | 3/1995 |
| KR | 10-1997-0077925 | 12/1997 |

OTHER PUBLICATIONS

PCT Search Report and Written Opinion dated Feb. 7, 2017 from corresponding International Application No. PCT/US2016/058957 filed Oct. 26, 2016.

* cited by examiner

*Primary Examiner* — Jue Zhang
*Assistant Examiner* — Trinh Q Dang
(74) *Attorney, Agent, or Firm* — Haynes and Boone, LLP

(57) ABSTRACT

A switching power converter is provided with a power-on-reset (POR) circuit that discharges essentially no current until a power supply voltage exceeds a POR threshold voltage.

13 Claims, 5 Drawing Sheets

SWITCHING POWER CONVERTER WITH ZERO CURRENT AT STARTUP

CROSS-REFERENCE TO RELATED APPLICATIONS

This application is a continuation of International Application No. PCT/US2016/058957 filed Oct. 26, 2016, which claims the benefit of U.S. Provisional Application No. 62/246,603 filed Oct. 26, 2015, both of which are hereby incorporated by reference in their entirety.

TECHNICAL FIELD

This application relates to power converters, and more particularly to a switching power converter with zero current at startup.

BACKGROUND

Switching power converters such as flyback converters or buck converters require a careful sequence of events at startup to ensure reliable and safe operation of both the switching power converter and any devices receiving power from the switching power converter. It is thus conventional for a switching power converter to include a power-on-reset (POR) circuit to manage the startup process. An example switching power converter 100 including a POR circuit 105 is shown in FIG. 1. An input voltage V_IN such as the rectified input voltage from an AC mains drives a power supply capacitor C1 through a startup resistor R1 to produce the power supply voltage V_CC. POR circuit 105 monitors the V_CC voltage to determine whether the V_CC power supply voltage is sufficiently high before initiating startup of a power stage 110 in switching power converter 100 through the assertion of a POR output signal (POR_OUT). A controller 115 responds to the assertion of the POR output signal by initiating the cycling of a power switch within power stage 110 to drive an output voltage V_OUT. During the cycling of the power switch, another path (for example, the auxiliary winding in a flyback converter embodiment) supports the V_CC power supply voltage.

But the cycling of the power switch cannot occur until POR circuit 105 asserts the POR output signal. While POR circuit 105 monitors the power supply voltage V_CC prior to asserting the POR output signal, it draws a POR current (I_POR) that is discharged to ground. The amount of the POR current has a direct impact on the delay necessary during startup until the power supply voltage V_CC reaches the POR threshold. The discharge of the POR current by POR circuit 105 is shown in further detail in FIG. 2. The startup resistor R1 and power supply capacitor C1 are as discussed with regard to FIG. 1. POR circuit 105 samples the power supply voltage V_CC through a voltage divider formed by a serial combination of a resistor R2 and a resistor R3 to produce a divided version of V_CC across resistor R3. A serial combination of a resistor R4 and a zener diode D1 produces a reference voltage across the zener diode D1 that a comparator U1 compares to the divided version of V_CC. In response to the divided version of V_CC exceeding the reference voltage, comparator U1 asserts the POR output signal (POR_OUT). Although such POR operation is conventional, the voltage divider will discharge the POR current (I_POR) into ground.

The load from the POR current may be better appreciated with reference to FIG. 3, which illustrates the V_CC waveform during startup. Upon application of the input voltage, V_CC begins to ramp up at a slope that depends primarily on the resistance for R1, the capacitance for C1, and the amplitude of the POR current. As the POR current is increased, the slope for the ramping of V_CC is decreased, which lengthens the delay necessary before V_CC crosses the POR threshold. At that point, V_CC drops due to the power consumption by control functions initiated by the assertion of the POR output signal. V_CC will then stabilize as the power switch cycles and drives the output voltage.

With regard to this POR process, note that it is conventional to have to design a switching power converter so as to satisfy a startup timing requirement at which the output voltage is regulated within a required output voltage tolerance (the minimum V_OUT regulation time). Achieving such a timing requirement is of course affected by the delay from the POR process. It is thus desirable to shorten the time needed for V_CC to cross the POR threshold. However, achieving such a reduction in the POR process delay faces several hurdles. For example, the minimum V_OUT regulation time must be satisfied even when the input voltage is at some minimum required value. To speed up the POR process despite such a relatively low value of the input voltage can be achieved by reducing the resistance of the startup resistor R1. But such a resistance reduction then increases power dissipation, which lowers operating efficiency and system reliability. To provide the low resistance while maintaining efficiency, it is conventional to decouple the start-up resistor after the POR process completion such as by isolating it through a switched-off depletion mode field effect transistor (FET). But this increases cost and complexity. Alternatively, the capacitance of the power supply capacitor C1 may be reduced but this capacitance has be sufficient to power the internal control circuitry during startup such that the capacitance has a well-defined minimum value.

Accordingly, there is a need in the art for a switching power converter power-on-reset circuit with reduced power consumption and increased operating speed.

SUMMARY

To provide reduced power consumption while minimizing the duration of the startup process, a switching power converter power-on-reset (POR) circuit is provided that consumes virtually no current until the POR output signal is asserted in response to the power supply voltage (V_CC) exceeding the POR threshold voltage. This zero current during startup is quite advantageous since power consumption by a conventional POR circuit is a major factor in lengthening the time necessary until the power supply voltage exceeds the POR voltage threshold for asserting the POR output signal. A startup resistor in series with a power supply capacitor produces the power supply voltage in a conventional fashion during the startup process. Since the POR circuit draws no current until the POR voltage threshold is reached, it does not slow the charging of the power supply voltage during that time. The startup resistor may thus have a relatively robust resistance to save power yet the POR delay is minimal. No depletion-mode FETs are thus required to isolate the startup resistor after startup, which advantageously lowers complexity and design costs.

To achieve the zero startup current, the POR circuit includes a first current path formed by a diode-connected transistor coupled to a zener diode through a first resistor. The first current path couples from a V_CC power supply voltage node (a node in between the startup resistor and the V_CC power supply capacitor) to ground but cannot begin conducting current until V_CC rises sufficiently above the zener diode breakdown voltage. The POR current also includes a second current path coupled between the V_CC power supply voltage node and ground. The second current path is formed by a current mirror transistor in series with a second resistor. The current mirror transistor has its gate coupled to the gate of the diode-connected transistor and its source coupled to the source of the diode-connected transistor so as to mirror the current in the diode-connected transistor. For example, the current in the current mirror transistor may be a multiple n of the current in the diode-connected transistor, where n is a number greater than 1.

The voltage over the second resistor forms the POR output signal. Initially, the POR output signal will be ground since the zener diode is not conducting, which in turn prevents the second current path from conducting. As the first current path begins conducting due to the zener diode reaching its breakdown voltage, so does the second current path being conducting, which causes the POR output signal to begin to rise in voltage due to resistance of the second resistor. The POR circuit includes a switch transistor configured to short the zener diode in the first current path. The POR output signal drives a gate of the switch transistor so as to force the switch transistor on as the POR output signal charges. The switching on of the switch transistor causes a rapid increase in current through the diode-connected transistor. In turn, the current through the current mirror transistor is rapidly increased, which causes the POR output signal to effectively rise to V_CC. The POR output signal can thus be asserted high with virtually no current discharge until the zener diode reaches its breakdown voltage. These advantageous features may be better appreciated from the detailed description below.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A POR circuit for a switching power converter is provided that has essentially zero current consumption until a V_CC power supply voltage reaches a POR voltage threshold. The POR circuit includes two current paths that couple from the V_CC power supply voltage node to ground. A first current path includes a diode-connected transistor coupled to a zener diode through a first resistor. The first current path thus cannot begin conducting until the voltage across the zener diode reaches its breakdown voltage. As will be explained further herein, the POR circuit may be designed such that the POR voltage threshold for the POR circuit approximately equals a sum of the threshold voltage for the diode-connected transistor and the zener breakdown voltage (Vz).

The POR circuit includes a second current path in which a current mirror transistor is in series with a second resistor. The current mirror transistor has its source tied to the source of the diode-connected transistor and its gate tied to the gate of the diode-connected transistor. The current mirror transistor will thus mirror a current conducted by the diode-connected transistor. For example, the current mirror transistor may be sized relative to the diode-connected transistor such that current mirror transistor conducts n times the current in the diode-connected transistor, where n is a number greater than one. The mirrored current in the second current path develops the POR output signal voltage across the second resistor. The POR output signal will thus be grounded until the power supply voltage reaches the POR threshold voltage. The POR output signal will then begin to charge. As the POR output charges, it switches on a switch transistor that shorts the zener diode. This shorting of the zener diode in turn causes a rapid increase in the current through the diode-connected transistor, which in turn is mirrored into an even greater increase in current through the current mirror transistor. This increase in current in the second current path causes the POR output signal to charge to effectively the power supply voltage.

Figure 1:
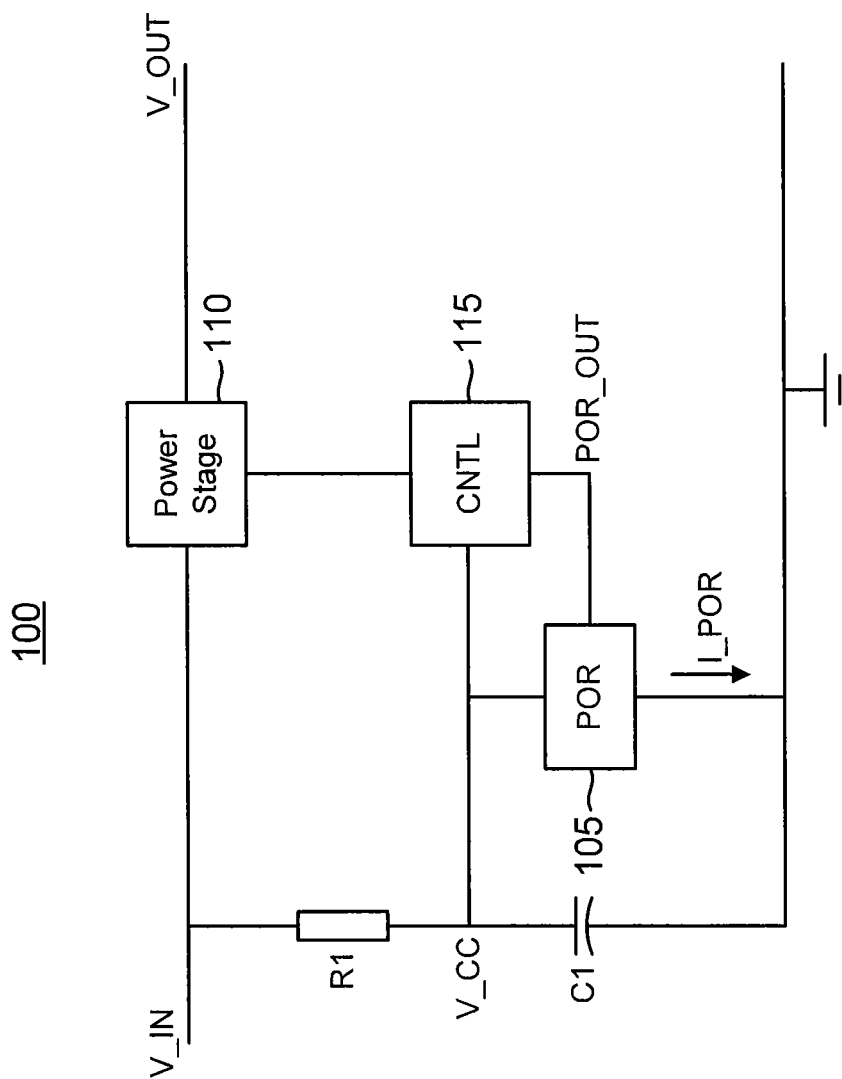
FIG. 1 is a diagram of a conventional switching power converter.
Figure 2:
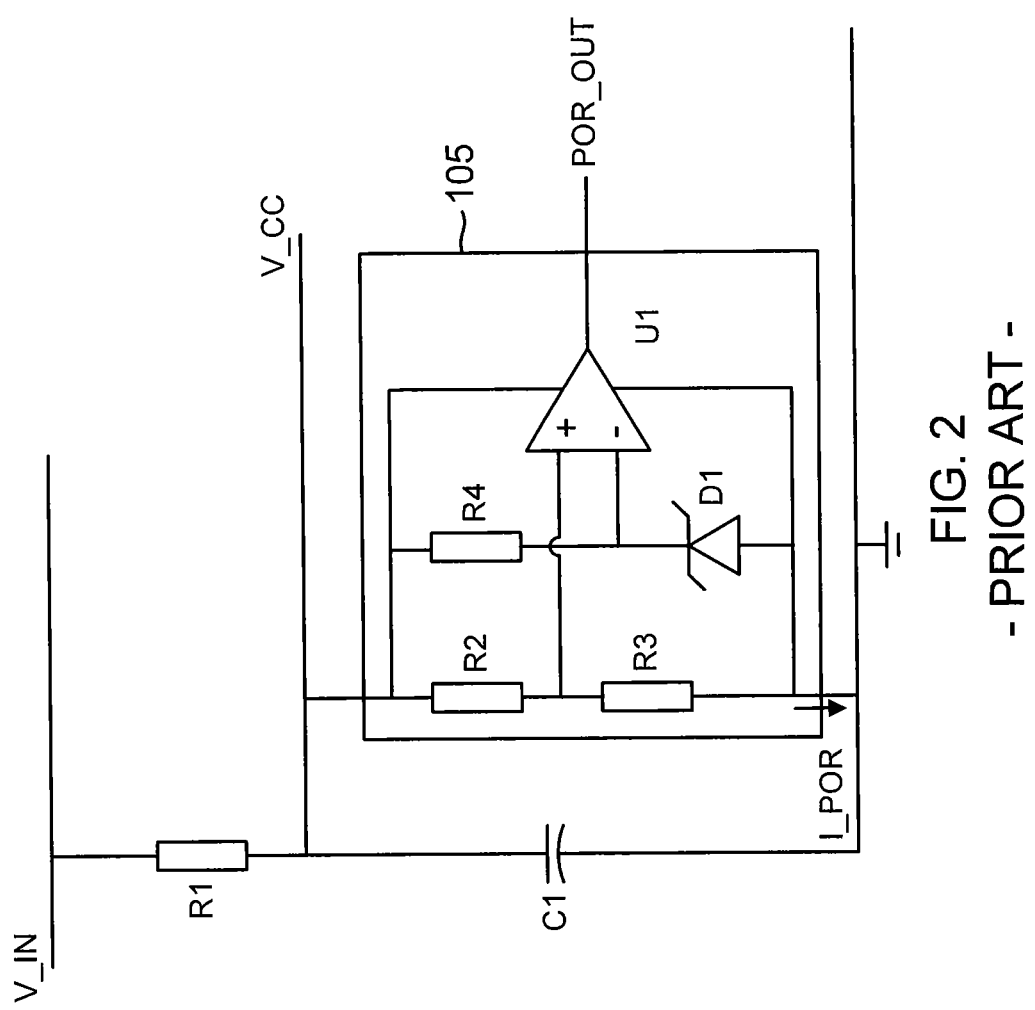
FIG. 2 is a circuit diagram of the POR circuit in the conventional switching power converter of FIG. 1.
Figure 3:
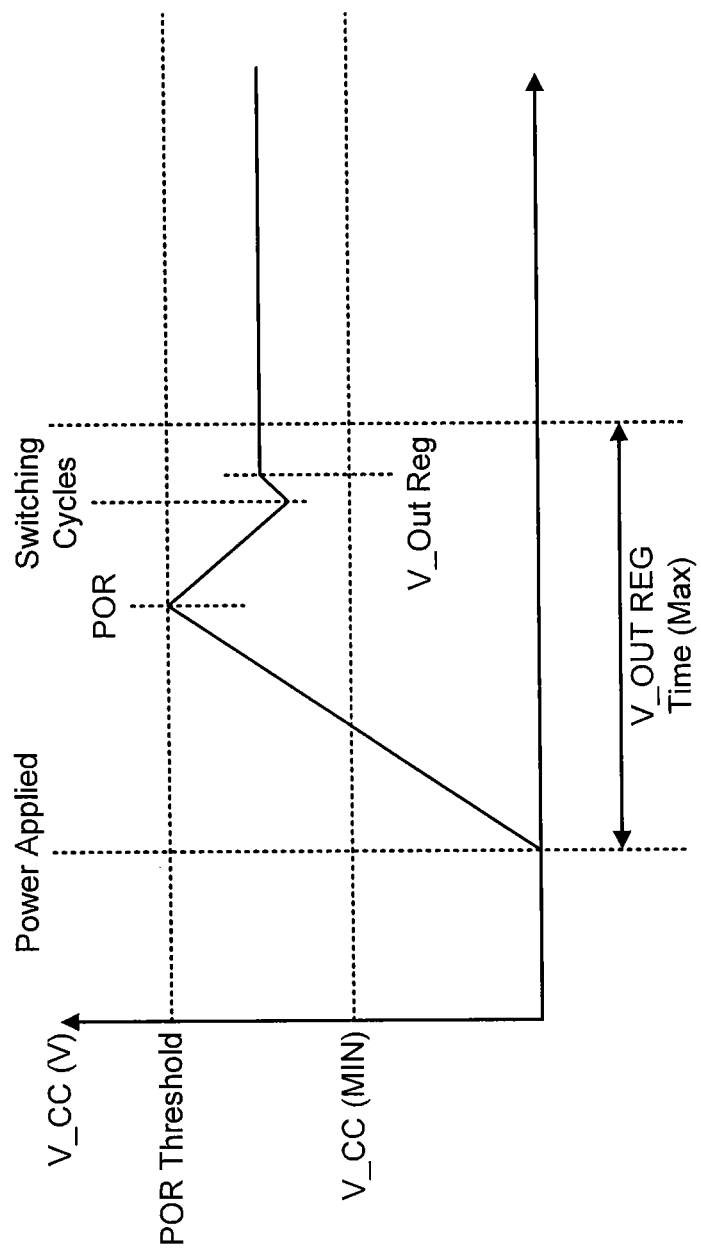
FIG. 3 illustrates the V_CC power supply voltage waveform during startup for the conventional switching power converter of FIG. 1.
Figure 4:
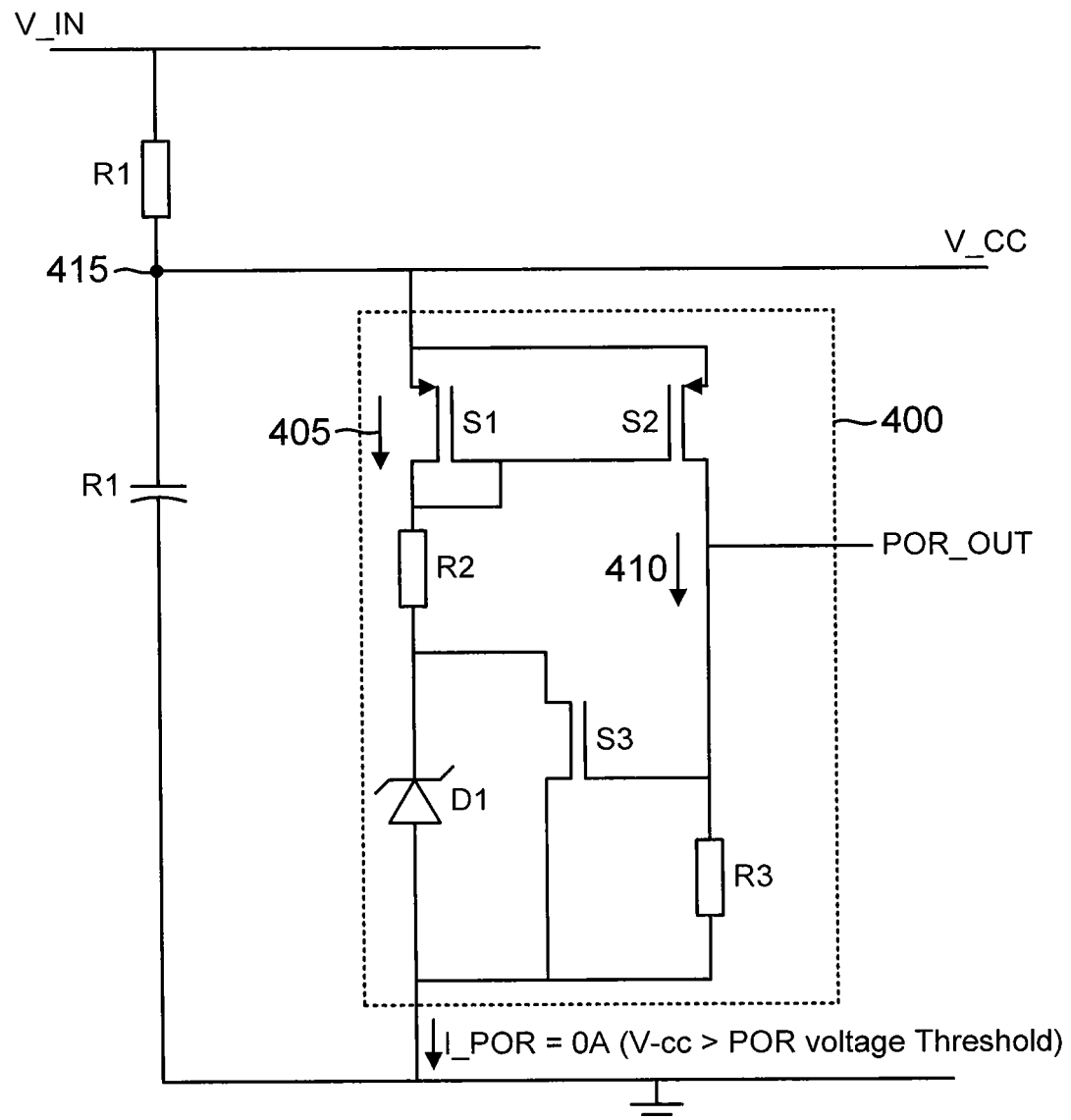
FIG. 4 is a circuit diagram of a POR circuit that has zero startup current until the input voltage reaches the POR threshold voltage in accordance with an aspect of the disclosure.

An example POR circuit 400 is shown in FIG. 4. The input voltage V_IN drives a startup resistor R1 in series with a power supply capacitor C1 to produce the power supply voltage (V_CC) at a power supply node 415 as discussed with regard to FIG. 1. A first current path 405 in POR circuit 400 couples from power supply node 415 to ground. First current path 405 includes a diode-connected PMOS transistor S1 having its source electrically connected to power supply node 415 and a drain coupled to ground through a second resistor R2 and a zener diode D1.

A second current path 410 in POR circuit 400 also couples from power supply node 415 to ground. A current mirror PMOS transistor S2 has its source tied to power supply node 415 and a gate tied to a gate (and drain) of diode-connected transistor S1. A drain of current mirror transistor S2 couples to ground through a third resistor R3. Current mirror transistor S2 is thus forms a current mirror with diode-connected transistor S1. The amount of current conducted through current mirror transistor S2 will depend upon its size (width and length) relative to the size of diode-connected transistor S1. In particular, current mirror transistor S2 is sized relative to diode-connected transistor S1 such that current mirror transistor S2 conducts a current that is n times greater than the current conducted by diode-connected transistor S1. The current (I1) conducted by diode-connected transistor S1 is essentially zero so long as the voltage across the zener diode D1 does not exceed its breakdown voltage (Vz). In response to V_CC surpassing the POR threshold voltage that equals (V_CC−Vz−Vth,p)/R2, where Vz is the breakdown voltage for zener diode D1, Vth,p is the threshold voltage for diode-connected transistor S1, and R2 is the resistance of second resistor R2. In turn, the POR output signal voltage equals n*I1*R3, which equals n*((V_CC−Vz−Vth,p)*R3/R2, where R3 is the resistance of third resistor R3.

An NMOS switch transistor S3 is configured to short zener diode D1 when the POR output signal rises above a threshold voltage for the NMOS switch transistor. In particular, a drain of switch transistor S3 is tied to the cathode of zener diode D1 and its source is tied to ground. The gate of switch transistor S3 is tied to the drain of current mirror transistor S2. The POR output signal thus drives the gate of switch transistor S3 and will cause it to conduct as the POR output signal rises above the threshold voltage (Vth,n) of switch transistor S3.

With zener diode D1 shorted, the current in diode-connected transistor S1 quickly increases to (V_CC−Vth,p)/R2. The voltage for the POR output signal will thus quickly increase to n*(V_CC−Vth,p)*R3/R2. Through a proper selection of the values for n, R2, and R3, the POR output signal may be guaranteed to effectively equal V_CC at the end of the startup period. It can also be shown that the POR threshold voltage at which POR circuit 400 drives the POR output signal from low (ground) to high (V_CC) is Vz+Vth,p+Vth,n/(n*R3/R2). If the factor Vth,n/(n*R3/R2) is relatively small, the POR threshold voltage essentially becomes Vz+Vth,p. Since zener diode D1 cannot conduct when V_CC is less than Vz+Vth,p, there is essentially no current conducted through POR circuit 400 until V_CC reaches the POR threshold voltage. Since the POR threshold voltage depends upon Vz, zener diode D1 may be replaced by a series of zener diodes to increase Vz. In that regard, it will be understood that zener diode D1 in POR circuit 400 may represent either a single zener diode or a plurality of serially-connected zener diodes.

Figure 5:
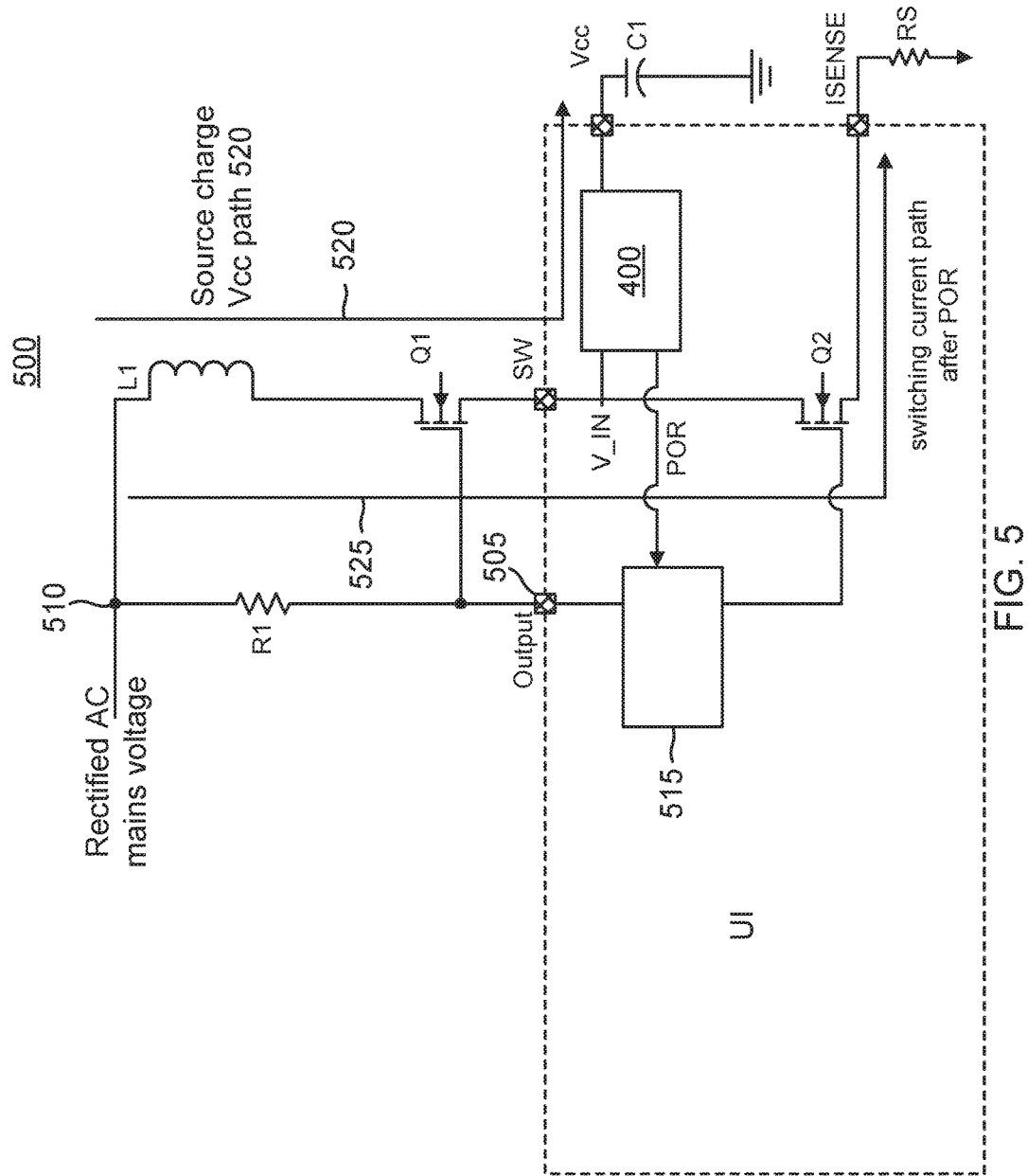
FIG. 5 illustrates a flyback converter controller including the POR circuit of FIG. 4 in accordance with an aspect of the disclosure.

With the power supply voltage fully asserted by the POR circuit, normal operation of the power switch in the corresponding switching power converter may ensue such that the power supply voltage is supplied through other means and POR circuit 400 deactivated. For example, a flyback converter 500 is shown in FIG. 5 that includes POR circuit 400. For illustration simplicity, only the primary winding L1 of a flyback converter transformer is shown for flyback converter 500. A controller integrated circuit U1 controls the switching of an NMOS power switch transistor Q1 to regulate an output voltage produced on a secondary side (not illustrated) of the transformer by driving a gate voltage of power switch transistor Q1 through an output terminal 505. Controller U1 includes a second NMOS transistor Q2 having a drain that couples to a source of power switch transistor Q1 through a switching terminal (SW) and having a source that couples to ground through a sense resistor RS. The sense resistor R2 couples between ground and an ISENSE terminal for controller U2.

During startup, transistor Q2 is off. A rectified AC mains voltage carried on an input node 510 will begin conducting through primary winding L1 because startup resistor R1 couples from input node 510 to output terminal 505 and thus charges the gate of power switch transistor Q1. The resulting source voltage for power switch transistor Q1 functions as the input voltage V_IN for POR circuit 400, which couples between the switching terminal and a VCC terminal. The power supply capacitor couples between the VCC terminal and ground. POR circuit 400 will thus function as discussed above to drive the power supply voltage during startup. When POR circuit 400 asserts the POR output signal, it is received by a controller 515 in controller integrated circuit U1. Controller 515 then proceeds to switch on transistor Q2 and begin cycling power switch Q1 to regulate the output voltage. Transistor Q2 thus effectively grounds the source voltage for power switch transistor Q1 such that POR circuit 400 is deactivated. An auxiliary winding (not illustrated) would then be used to maintain the power supply voltage stored across power supply capacitor C1. The current through primary winding L1 thus flows through the source of power switch Q1 into a source charging path 520 through POR circuit 400 to charge the power supply voltage during startup (the POR period). In contrast, the current through primary winding L1 flows through power switch transistor Q1 into second transistor Q2 and out the ISENSE terminal in a switching current path 525 after the POR period.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

The invention claimed is:

1. A power-on-reset (POR) circuit for a switching power converter, comprising:
 a power supply node for providing a power supply voltage;
 a first current path coupled from the power supply node to ground, wherein the first current path includes a diode-connected transistor coupled in series with a zener diode through a first resistor;
 a second current path coupled from the power supply node to ground, wherein the second current path includes a current mirror PMOS transistor in series with a second resistor, and wherein a source of the current mirror PMOS transistor is tied to a source of the diode-connected transistor and to the power supply node, a gate of the current mirror PMOS transistor is tied to a gate of the diode-connected transistor, and a drain of the current mirror PMOS transistor is coupled to the second resistor, and
 an NMOS switch transistor coupled between a cathode of the zener diode and ground wherein a gate of the NMOS switch transistor is tied to the drain of the current mirror PMOS transistor, a drain of the NMOS switch transistor is tied to the cathode of the zener diode, and a source of the NMOS switch transistor is tied to ground.

2. The POR circuit of claim 1, wherein the diode-connected transistor is a PMOS transistor having a source tied to the power supply node and a drain coupled to the first resistor.

3. The POR circuit of claim 1, wherein the switching power converter includes:
 a startup resistor; and
 a power supply capacitor in series with the startup resistor through the power supply node.

4. The POR circuit of claim 1, wherein the switching power converter is a buck converter.

5. The POR circuit of claim 1, wherein the current mirror PMOS transistor is sized relative to the diode-connected transistor such that the current mirror PMOS transistor conducts a larger current than a current conducted by the diode-connected transistor.

6. The POR circuit of claim 3, wherein the switching power converter is a flyback converter including an input node for carrying a rectified AC mains voltage, and wherein the startup resistor is coupled to the input node.

7. The POR circuit of claim 6, wherein the POR circuit is included within a controller integrated circuit for the flyback converter.

8. The POR circuit of claim 7, wherein the controller integrated circuit includes a switching terminal for driving a gate of a power switch transistor coupled to a primary winding for the flyback converter, and wherein the startup resistor is coupled between the input node and the switching terminal.

9. A method, comprising:
- during a power-on-reset (POR) procedure for a switching power converter, receiving a source voltage at a first terminal of a startup resistor having a second terminal coupled through a power supply node to a power supply capacitor to charge the power supply node with an increasing power supply voltage;
- in a first current path coupled to the having a diode-connected transistor in series with a zener diode through a first resistor, conducting no current while the increasing power supply voltage is less than a POR threshold voltage that depends upon a breakdown voltage for the zener diode;
- in the first current path, conducting a first current path current in response to the power supply voltage becoming greater than the POR threshold voltage;
- mirroring the first current path current through a second current path having a current mirror transistor configured to form a current mirror with the diode-connected transistor to conduct a second current path current through the second current path to charge a POR output signal across a second resistor in the second current path;
- in response to the charging of the POR output signal, switching on a switch coupled between a cathode of the zener diode and ground to short the zener diode to increase the first current path current; and
- in response to the increase in the first current path current, increasing the second current path current to charge the POR output signal to substantially equal the power supply voltage.

10. The method of claim 9, further comprising:
- rectifying an AC mains voltage to produce a rectified input voltage that drives a serial combination of a startup resistor and a power supply capacitor to provide the source voltage at a terminal of the power supply capacitor.

11. The method of claim 9, wherein mirroring the first current path current causes the the second current path current to be greater than the first current path current.

12. The method of claim 9, further comprising:
- in response to the charging of the POR output signal substantially to the power supply voltage, initiating a cycling of a power switch transistor.

13. The method of claim 12, further comprising grounding the source voltage in response to the charging of the POR output signal substantially to the power supply voltage.

* * * * *